(12) United States Patent
Visintin

(10) Patent No.: US 10,711,137 B2
(45) Date of Patent: Jul. 14, 2020

(54) PIGMENT COMPOSITIONS CONTAINING CHLORINATED COPPER PHTHALOCYANINE PIGMENTS IN THE GAMMA CRYSTAL FORM

(71) Applicant: Sun Chemical Corporation, Parsippany, NJ (US)

(72) Inventor: Pamela M. Visintin, Charleston, SC (US)

(73) Assignee: Sun Chemical Corporation, Parsippany, NJ (US)

( * ) Notice: Subject to any disclaimer, the term of this patent is extended or adjusted under 35 U.S.C. 154(b) by 0 days.

(21) Appl. No.: 16/401,488

(22) Filed: May 2, 2019

(65) Prior Publication Data

US 2019/0256712 A1     Aug. 22, 2019

Related U.S. Application Data

(63) Continuation of application No. PCT/US2017/059468, filed on Nov. 1, 2017.

(60) Provisional application No. 62/416,759, filed on Nov. 3, 2016.

(51) Int. Cl.
| | | |
|---|---|---|
| *C09B 47/10* | (2006.01) | |
| *C09B 67/00* | (2006.01) | |
| *C09D 11/322* | (2014.01) | |
| *C09D 7/41* | (2018.01) | |
| *C09D 11/037* | (2014.01) | |
| *G03F 7/00* | (2006.01) | |
| *C09B 47/14* | (2006.01) | |
| *C09B 67/50* | (2006.01) | |
| *C09B 47/06* | (2006.01) | |
| *C09B 67/22* | (2006.01) | |
| *C09D 5/24* | (2006.01) | |
| *H01L 51/00* | (2006.01) | |
| *C09D 5/03* | (2006.01) | |
| *C09D 5/36* | (2006.01) | |
| *C09D 5/10* | (2006.01) | |
| *C09B 67/46* | (2006.01) | |

(52) U.S. Cl.
CPC ............ *C09B 47/14* (2013.01); *C09B 47/061* (2013.01); *C09B 67/009* (2013.01); *C09B 67/0026* (2013.01); *C09B 67/0035* (2013.01); *C09D 5/035* (2013.01); *C09D 5/103* (2013.01); *C09D 5/24* (2013.01); *C09D 5/36* (2013.01); *C09D 7/41* (2018.01); *C09D 11/037* (2013.01); *C09D 11/322* (2013.01); *H01L 51/0078* (2013.01)

(58) Field of Classification Search
CPC . C09B 47/10; C09B 67/0026; C09B 67/0032; C09D 11/322; C09D 7/41; C09D 11/037; G03F 7/0007
See application file for complete search history.

(56) References Cited

U.S. PATENT DOCUMENTS

| | | | |
|---|---|---|---|
| 2,910,482 | A | 10/1959 | Gottlieb |
| 3,051,721 | A | 8/1962 | Pfeiffer |
| 3,160,635 | A | 12/1964 | Knudsen et al. |
| 3,770,765 | A | 11/1973 | Jaffe |
| 4,108,863 | A | 8/1978 | Komai et al. |
| 4,135,944 | A | 1/1979 | Wheeler |
| 4,152,171 | A | 5/1979 | Barraclough et al. |
| 4,205,995 | A | 6/1980 | Wheeler et al. |

FOREIGN PATENT DOCUMENTS

| | | |
|---|---|---|
| EP | 1 956 051 A2 | 8/2008 |
| JP | H 07-103321 B2 | 11/1995 |
| JP | 5481873 B2 | 4/2014 |

OTHER PUBLICATIONS

International Search Report and Written Opinion dated Feb. 2, 2018 for Application No. PCT/US2017/059468, 13 pgs.

*Primary Examiner* — Brenda L Coleman

(74) *Attorney, Agent, or Firm* — Frost Brown Todd LLC

(57) ABSTRACT

The present technology is directed to pigment compositions having a pure, or substantially pure, γ crystal form, containing less chlorine than standard tetrachlorinated copper phthalocyanine pigments, while giving similar color space, chromaticity, fastness properties, and color travel in automotive waterborne and solvent borne systems. These pigments are more advantageous from a toxicity and environmental perspective, and allow the manufacturer to produce pigments in a safe and economical manner.

11 Claims, 1 Drawing Sheet

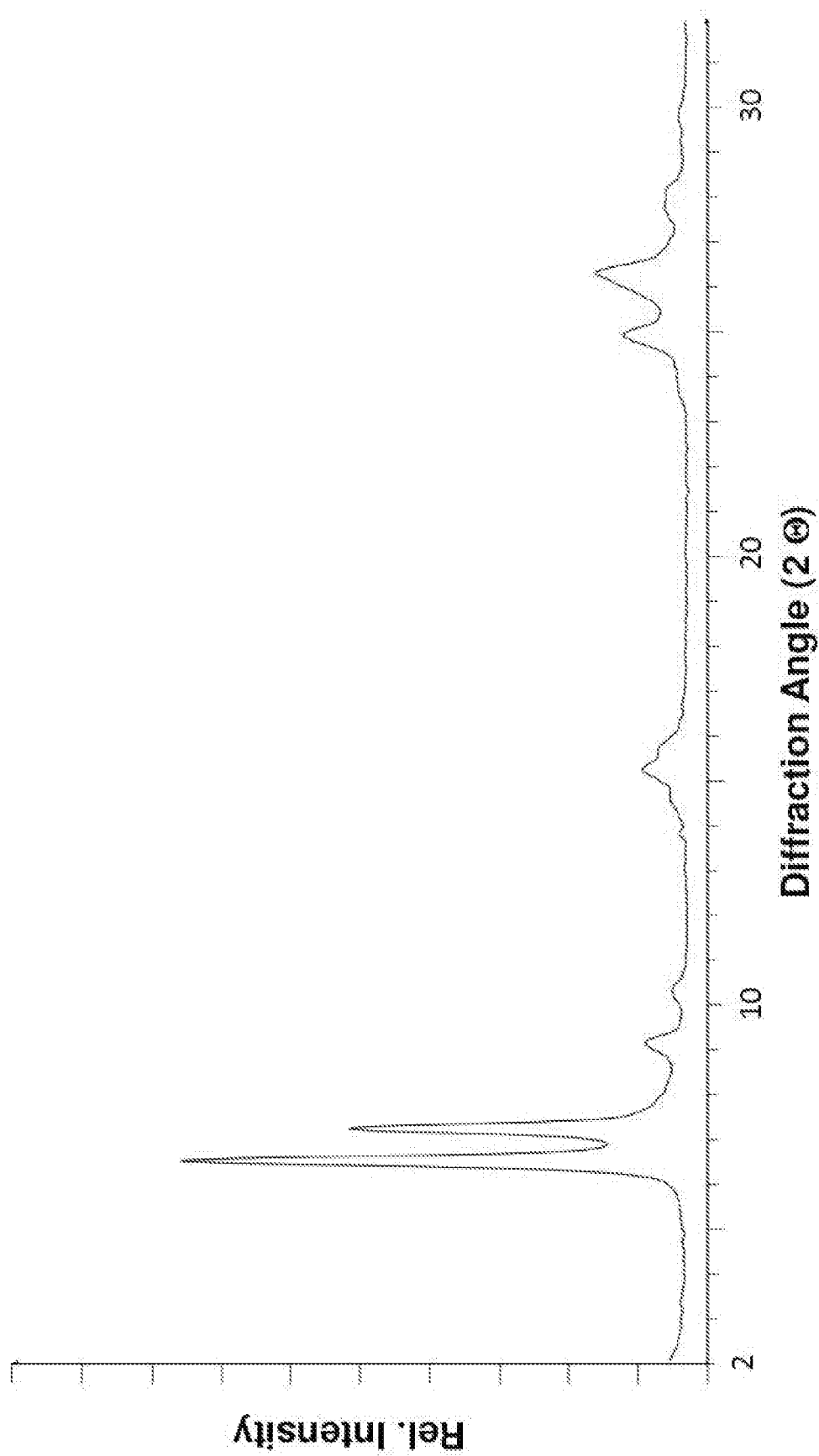

PIGMENT COMPOSITIONS CONTAINING CHLORINATED COPPER PHTHALOCYANINE PIGMENTS IN THE GAMMA CRYSTAL FORM

CROSS-REFERENCE TO RELATED APPLICATIONS

This application is a continuation of U.S. application Ser. No. PCT/US17/59468, entitled "PIGMENT COMPOSITIONS CONTAINING CHLORINATED COPPER PHTHALOCYANINE PIGMENTS IN THE GAMMA CRYSTAL FORM," filed Nov. 1, 2017, which claims priority to U.S. Provisional Application No. 62/416,759, entitled, "Copper Phthalocyanine Pigment Composition Having a New Crystal Form," filed Nov. 3, 2016, the disclosures of which are incorporated by reference herein.

BACKGROUND OF THE INVENTION

Chlorinated copper phthalocyanine pigments are of commercial importance because of their beautiful colors, great strength, and stability. It is known that copper phthalocyanine may be obtained in several different crystal forms. The most common crystal forms are α, β, γ, δ, and ε (or "R" form). Table 1 lists X-ray data of the d (interplanar spacings, Å) of these crystal forms, as reported in the patent literature (U.S. Pat. Nos. 3,160,635, 2,910,482, 4,205,995, 3,051,721, and 4,135,944). They also differ in color. The α-form copper phthalocyanine is a reddish blue color, the β-form is a greenish blue color, and the γ and δ-forms exhibit shades falling between the α- and β-forms. The ε-form is the reddish known form of copper phthalocyanine. U.S. Pat. No. 4,108,863 discloses the "ρ" crystal form, and also provides data for the π-type, and χ-type crystal forms. JP 07103321 discloses a new crystal form (not specifically labeled) of phthalocyanine and also provides data for the χ-type and τ-type crystal forms.

BRIEF SUMMARY

The present technology is directed to pigments, primarily in the γ phase, containing less chlorine than standard tetrachlorinated copper phthalocyanine pigments, while giving similar color space, chromaticity, fastness properties, and color travel in automotive waterborne and solvent borne systems. These pigments are more advantageous from a toxicity and environmental perspective, and allow the manufacturer to produce pigments in a safe and economical manner.

BRIEF DESCRIPTION OF DRAWINGS

FIGURE: X-ray Diffraction Pattern of the γ crystal form of a chlorinated copper phthalocyanine pigment composition in Example 1.

DETAILED DESCRIPTION OF THE INVENTION

The present technology is directed to pigment compositions having a pure, or substantially pure, γ crystal form, containing less chlorine than standard tetrachlorinated copper phthalocyanine pigments, while giving similar color space, chromaticity, fastness properties, and color travel in automotive waterborne and solvent borne systems. These pigments are more advantageous from a toxicity and environmental perspective, and allow the manufacturer to produce pigments in a safe and economical manner.

The disclosed monochlorinated copper phthalocyanine pigments can be prepared by routine phthalocyanine synthesis procedures and offer the pigment manufacturer an environmentally friendlier, safer, less toxic means to prepare pigment products with properties similar to a standard tetrachloro-copper phthalocyanine pigment without the risks related to handling and using chlorine gas.

The present invention provides chlorinated copper phthalocyanine pigment compositions having a pure, or substantially pure, γ crystal form which differs from any of those reported in the above-cited literature references. This γ crystal form has a different X-ray powder diffraction pattern. X-ray diffraction peaks of typical samples are characterized by their d (interplanar spacings, Å), as summarized in Table 2. The values given in Table 2 are those with relative intensity≥5% and d≥2.5 Å. X-ray powder diffraction patterns were obtained using a Siemens D5000 Diffractometer with graphite-monochromated Cu K$\alpha_1$ radiation ($\lambda$=1.5406 Å). FIG. 1 illustrates the X-ray diffraction pattern. The powder pigment sample was tightly packed in a 2"×2" standard sample holder. The sample holder was then loaded to the X-ray Diffractometer for analysis. The instrument was calibrated by using a quartz standard from Bruker AXS, Inc. (P/N C72298A227B36). The X-ray diffraction peaks are understood to be within experimental bounds and can result in slightly different peaks. It is also understood that other test methods could produce different peaks.

TABLE 1

X-ray diffraction data of common crystal forms of copper phthalocyanine

| U.S. Pat. No. 3,160,635 α Form | | U.S. Pat. No. 3,160,635 β Form | | U.S. Pat. No. 3,160,635 δ Form | | U.S. Pat. No. 2,910,482; U.S. Pat. No. 4,205,995 γ Form | | U.S. Pat. No. 3,051,721; U.S. Pat. No. 4,135,944 ε or "R" Form | |
|---|---|---|---|---|---|---|---|---|---|
| d (Å) | Rel. Intensity (%) | d (Å) | Rel. Intensity (%) | d (Å) | Rel. Intensity (%) | d (Å) | Rel. Intensity (%) | d (Å) | Rel. Intensity (%) |
| 13.0 | 100 | 12.7 | 100 | 12.0 | 100 | 12.80 | 100 | 11.6 | 100 |
| 12.1 | 75 | 9.64 | 68 | 9.55 | 82 | 9.02 | 15 | 9.66 | 92 |
| 8.9 | 12 | 8.5 | 9 | 7.78 | 2 | 5.75 | 34 | 7.80 | 3 |
| 5.68 | 12 | 7.2 | 9 | 6.24 | 7 | 3.42 | 34 | 6.24 | 7 |
| 5.32 | 10 | 4.91 | 13 | 5.18 | 7 | 3.30 | 26 | 5.27 | 8 |
| 3.71 | 10 | 4.82 | 12 | 5.07 | 11 | | | 5.07 | 14 |

TABLE 1-continued

X-ray diffraction data of common crystal forms of copper phthalocyanine

| U.S. Pat. No. 3,160,635 α Form | | U.S. Pat. No. 3,160,635 β Form | | U.S. Pat. No. 3,160,635 δ Form | | U.S. Pat. No. 2,910,482; U.S. Pat. No. 4,205,995 γ Form | | U.S. Pat. No. 3,051,721; U.S. Pat. No. 4,135,944 ε or "R" Form | |
|---|---|---|---|---|---|---|---|---|---|
| d (Å) | Rel. Intensity (%) | d (Å) | Rel. Intensity (%) | d (Å) | Rel. Intensity (%) | d (Å) | Rel. Intensity (%) | d (Å) | Rel. Intensity (%) |
| 3.57 | 9 | 4.17 | 7 | 4.31 | 5 | | | 4.35 | 5 |
| 3.34 | 15 | 3.75 | 29 | 4.17 | 7 | | | 4.17 | 8 |
| 3.24 | 17 | 3.42 | 17 | 4.08 | 6 | | | 4.05 | 15 |
| | | 3.19 | 6 | 3.76 | 6 | | | 3.77 | 15 |
| | | 2.94 | 12 | 3.43 | 5 | | | 3.44 | 6 |
| | | | | 3.24 | 8 | | | 3.30 | 11 |
| | | | | 3.11 | 10 | | | 3.14 | 19 |
| | | | | 2.97 | 6 | | | 2.96 | 13 |
| | | | | | | | | 2.89 | 3 |
| | | | | | | | | 2.79 | 3 |
| | | | | | | | | 2.71 | 3 |

TABLE 2

X-ray diffraction data of the γ crystal form of a chlorinated copper phthalocyanine pigment composition

| 2Θ (Å) | d (Å) | Rel. Intensity (%) |
|---|---|---|
| 6.5 | 13.66 | 100 |
| 7.2 | 12.29 | 68 |
| 9.1 | 9.71 | 11 |
| 10.3 | 8.61 | 6 |
| 15.2 | 5.81 | 12 |
| 15.6 | 5.66 | 9 |
| 23.8 | 3.74 | 5 |
| 25.0 | 3.56 | 15 |
| 26.4 | 3.38 | 21 |
| 27.9 | 3.20 | 7 |
| 28.2 | 3.16 | 7 |

The γ crystal form, chlorinated copper phthalocyanine pigment compositions contain less chlorine than standard tetrachlorinated copper phthalocyanine pigments, while giving similar color space, chromaticity, fastness properties, and color travel in automotive waterborne and solvent borne systems. A need exists for minimally chlorinated phthalocyanine pigments and pigment compositions, wherein the average number of chlorines in the pigment composition is 1, such as a monochlorinated copper phthalocyanine pigment. These chlorinated phthalocyanine pigments are safer, less toxic, and pose less of an environmental impact than highly chlorinated phthalocyanine pigments containing at least 4 chlorine atoms.

The present invention provides a process for the production of chlorinated copper phthalocyanine pigment compositions having X-ray diffraction spectra corresponding to a pure, or substantially pure, γ crystal form. The γ crystal form is the major phase, which preferably comprises at least 70% of the crystal form, more preferably at least 80% of the crystal form, most preferably at least 90% of the crystal form. The preferred process for synthesizing these γ form chlorinated copper phthalocyanine pigments is the phthalic anhydride—urea process (Wyler Method), but the synthesis is not limited to any particular method. For example, the disclosed chlorinated copper phthalocyanine pigment composition may be synthesized at an elevated temperature (i.e., 200° C.) in an organic solvent with phthalic anhydride, chlorophthalic anhydrides, a nitrogen source, at least one copper compound, and a catalyst, in the presence of an additive (i.e., a sulfonated copper phthalocyanine derivative) that acts as a crystal phase director. The particle size and shape can be influenced by the synthesis process, the selection of the reaction media during the synthesis step, and the subsequent finishing steps (e.g. autoclaving, salt attrition, ball milling, etc.). Typical particle size may range between 20-500 nm, 20-200 nm, and 20-90 nm.

The methods provided herein produce on-average, a copper phthalocyanine pigment composition that is monochlorinated and the γ crystal form is the major phase. The pigment compositions disclosed herein may be suitable for coatings (such as automotive paints), plastics, printing inks, waterborne or solvent borne pigment preparations, electrophotographic toners and developers, powder coating materials, inks, preferably ink-jet inks, color filters, and coloring seed.

TABLE 3

A γ crystal form of a chlorinated copper phthalocyanine pigment composition is provided. This composition is characterized by the following X-ray diffraction data:

| d (Å) | Rel. Intensity (%) |
|---|---|
| 13.66 | 100 |
| 12.29 | 68 |
| 9.71 | 11 |
| 8.61 | 6 |
| 5.81 | 12 |
| 5.66 | 9 |
| 3.74 | 5 |
| 3.56 | 15 |
| 3.38 | 21 |
| 3.20 | 7 |
| 3.16 | 7 |

The present invention has been described in detail, including the preferred embodiments thereof. However, it will be appreciated that those skilled in the art, upon consideration of the present disclosure, may make modifications and/or improvements on this invention that fall within the scope and spirit of the invention.

EXAMPLES

The following examples illustrate specific aspects of the present invention and are not intended to limit the scope thereof in any respect and should not be so construed.

Example 1

In a 1-L resin flask, 92.8 g of phthalic anhydride, 27.2 g of 3-chlorophthalic anhydride, 11.0 g of 4-chlorophthalic anhydride, 163.5 g of urea, 20.7 g of copper(I) chloride, 0.5 g of ammonium dimolybdate, 6.5 g of Polymeric Dispersant A, and 485 g of light branched alkylbenzene solvent were heated to 200° C. with agitation. The reaction was allowed to stir for 2.5-3 h at 200° C. After this time, the contents were cooled to room temperature and the solvent was removed in vacuo. The crude residue was allowed to stir in 2500 g of water and 100 g of concentrated sulfuric acid for 2 h at 90° C. The crude presscake was isolated by filtration, washed to conductivity less than 100 μmhos/cm, dried, and then homogenized in an Osterizer mixer. The obtained blue crude (Crude #1) was verified by X-ray analysis (FIG. 1) corresponding to that characterizing the new γ crystal form. The crystal form of the pigment composition as denoted by it X-ray spectrum, was unchanged by heating 10 g of the pigment composition in 80 g of xylene at 100° C. for 20 hrs. There was no evidence of crystal growth either.

Polymeric Dispersant A:
Pc-[$SO_2$—NH—($CHCH_3CH_2O$)$_x$($CH2CH2O$)$_y$—$CH_3$]$_n$,
where Pc is a radical of copper phthalocyanine, x is 0 to about 30, y is 0 to about 100, x+y≥3, and n is 1-4.

Crude #1 (27 g) was then attritted with salt (216 g) and propylene glycol (48 g) in a laboratory kneader at 80° C. for 6 h. At the completion of the attrition, the mixture was suspended in water, agitated at ambient temperature, and concentrated HCl was added until the slurry had a pH<1.0. The slurry was then heated to 90° C., held for 1 h, and then filtered. The pigment was isolated by filtration, washed to a conductivity less than 250μmhos/cm, or 100 μmhos/cm, dried, homogenized in an Osterizer mixer, and passed through a 60-mesh screen to afford a finished product. Example #1 and the standard (Palomar® Blue 248-4806) were dispersed in a DuPont waterborne paint system for 3 hours on a Skandex shaker with a Pigment/Binder of 8.83/3.19. The paint formulation containing Example #1 and the standard were sprayed on panels in a temperature-controlled and moisture-controlled spray booth. The equipment inside of the spray booth is called an Automatic Test Panel Spray Machine (Spraymation, Inc.).

Table 4 shows the CIE L*a*b* data of the panels in 50 Aluminum (DuPont 50% Aluminum waterborne paint system [ratio of aluminum/pigment in the paint film is 50/50, formulated from product code: 54-47166 and pigment]). Data for the 50 Aluminum was obtained using an X-Rite MA-68 multi-angle spectrophotometer. The data in Tables 4 and 5 shows that Example #1 is close in hue and lightness to the standard, has better chroma than the standard, and has an essentially neutral color travel as indicated by the travel (ΔH=−3.3). The term "color travel" refers to a change in apparent color value of a metallic paint film when measured from a 15° to 110° viewing angle. The term "travel delta hue (Travel ΔH)" used herein refers to a difference in hue between the 15° measurement and the 110° measurement. When there is no difference between the two measurements (i.e., Travel ΔH=0), the down travel is said to be "neutral." The smaller the travel ΔH, the better the appearance of the paint. The data in Table 4 confirms that the inventive monochlorinated copper phthalocyanine pigment may be an alternative to commercially available tetrachlorocopper phthalocyanine pigments, and is more advantageous from a safety, toxicity and environmental perspective.

TABLE 4

CIE L*a*b* Data for Example #1 Relative to Standard in 50 Aluminum (DH, DC, DL and DE are not adjusted to equal strength)

| | | Pigment | | | | | |
|---|---|---|---|---|---|---|---|
| | Angle | ΔH | ΔC | ΔL | ΔE | Δa | Δb |
| 248-4806* | Std | Std | Std | Std | Std | Std | Std |
| Example #1 | 15° | 7.2 | 4.0 | −1.5 | 8.4 | 1.6 | −8.1 |
| | 25° | 5.0 | 2.3 | −6.8 | 8.7 | 1.7 | −5.2 |
| | 45° | 1.8 | 0 | −5.5 | 5.7 | 1.6 | −0.8 |
| | 75° | 2.0 | −0.5 | −3.2 | 3.8 | 2.0 | 0.3 |
| | 110° | 3.3 | −0.1 | −2.5 | 4.1 | 3.3 | 0 |
| | Travel | | | Δ H = −3.3 ΔL = −1.0 | | | |

*The standard is Palomar® Blue 248-4806, a commercially available PB 15:1 from Sun Chemical.

TABLE 5

Color Data (Absolute Values) for Example 1:
CIE L*a*b* Data for Pigment #1 Relative to
Standard in 95 W Tints (Sprayed Panels)

| Pigment | H | *C | *L | *a | *b |
|---|---|---|---|---|---|
| 248-4806 | 232.8 | 38.4 | 64.0 | −23.2 | −30.6 |
| Example #1 | 236.8 | 39.5 | 60.6 | −21.6 | −33.0 |

Example 2

In a 1-L resin flask, 92.8 g of phthalic anhydride, 32.5 g of 3-chlorophthalic anhydride, 5.7 g of 4-chlorophthalic anhydride, 163.5 g of urea, 20.7 g of copper(I) chloride, 0.5 g of ammonium dimolybdate, 6.5 g of Polymeric Dispersant A, and 485 g of light branched alkylbenzene solvent were heated to 200° C. with agitation. The reaction was allowed to stir for 2.5-3 h at 200° C. After this time, the contents were cooled to room temperature and the solvent was removed in vacuo. The crude residue was allowed to stir in 2500 g of water and 100 g of concentrated sulfuric acid for 2 h at 90° C. The crude presscake was isolated by filtration, washed to conductivity less than 100 μmhos/cm, dried, and then homogenized in an Osterizer mixer. The obtained blue crude (Crude #2) has an X-ray diffraction spectrum characteristic of the γ crystal form shown in FIG. 1.

Polymeric Dispersant A:
Pc-[$SO_2$—NH—($CHCH_3CH_2O$)$_x$($CH2CH2O$)$_y$—$CH_3$]$_n$,
where Pc is a radical of copper phthalocyanine, x is 0 to about 30, y is 0 to about 100, x+y≥3, and n is 1-4.

Crude #2 (27 g) was then attritted with salt (216 g) and propylene glycol (48 g) in a laboratory kneader at 80° C. for 6 h. At the completion of the attrition, the mixture was suspended in water, agitated at ambient temperature, and concentrated HCl was added until the slurry had a pH<1.0. The slurry was then heated to 90° C., held for 1 h, and then filtered. The pigment was isolated by filtration, washed to a conductivity less than 100 μmhos/cm, dried, homogenized in an Osterizer mixer, and passed through a 60-mesh screen to afford a finished product. Example #2 and the standard (Palomar® Blue 248-4806) were dispersed in a DuPont waterborne paint system for 3 hours on a Skandex shaker with a Pigment/Binder of 8.83/3.19. The paint formulation containing Example #2 and the standard were sprayed on panels in a temperature-controlled and moisture-controlled spray booth. The equipment inside of the spray booth is called an Automatic Test Panel Spray Machine (Spraymation, Inc.).

Table 6 shows the CIE L*a*b* data of the panels in 50 Aluminum (DuPont 50% Aluminum waterborne paint system [ratio of aluminum/pigment in the paint film is 50/50, formulated from product code: 54-47166 and pigment]). Data for the 50 Aluminum was obtained using an X-Rite MA-68 multi-angle spectrophotometer. The data in Tables 6 and 7 shows that Example #2 is close in hue and lightness to the standard, has better chroma than the standard, and has an essentially neutral color travel as indicated by the travel ($\Delta H=-1.2$). The data in Table 5 confirms that the γ monochlorinated copper phthalocyanine pigment may be an alternative to commercially available tetrachloro copper phthalocyanine pigments, and is more advantageous from a safety, toxicity and environmental perspective.

TABLE 6

CIE L*a*b* Data for Example #2 Relative to Standard in 50 Aluminum
(DH, DC, DL and DE are not adjusted to equal strength)

| | | Pigment | | | | | |
|---|---|---|---|---|---|---|---|
| | Angle | ΔH | ΔC | ΔL | ΔE | Δa | Δb |
| 248-4806* | Std | Std | Std | Std | Std | Std | Std |
| Example #2 | 15° | 4.9 | 3.9 | −1.5 | 6.4 | 0.1 | −6.2 |
| | 25° | 3.1 | 2.5 | −4.7 | 6.2 | 0.2 | −4.0 |
| | 45° | 1.1 | 0.3 | −4.1 | 4.2 | 0.8 | −0.8 |
| | 75° | 2.3 | −0.1 | −2.5 | 3.4 | 2.3 | −0.2 |
| | 110° | 3.7 | 0.6 | −2.0 | 4.3 | 3.7 | −0.7 |
| | Travel | | | ΔH = −1.2 ΔL = −0.5 | | | |

*The standard is Palomar ® Blue 248-4806, a commercially available PB 15:1 from Sun Chemical.

TABLE 7

Color Data (Absolute Values) for Example #2:
CIE L*a*b* Data for Example #2 Relative to
Standard in 95 W Tints (Sprayed Panels)

| Pigment | H | *C | *L | *a | *b |
|---|---|---|---|---|---|
| 248-4806 | 232.8 | 38.4 | 64.0 | −23.2 | −30.6 |
| Example #2 | 235.7 | 39.5 | 61.2 | −22.3 | −32.6 |

What is claimed is:

1. A chlorinated copper phthalocyanine pigment composition of a pure, or substantially pure, γ crystal form having an X-ray powder diffraction pattern in accordance with that shown in the FIGURE.

2. The pigment composition of claim 1, where the pigment composition has X-ray powder diffraction d-values at about 13.66, 12.29, 9.71, 8.61, 5.81, 5.66, 3.56, 3.38, 3.20, and 3.16.

3. A chlorinated copper phthalocyanine pigment composition of claim 1, comprising greater than about 70% of the γ crystal form.

4. A chlorinated copper phthalocyanine pigment composition of claim 1, comprising greater than about 80% of the γ crystal form.

5. A chlorinated copper phthalocyanine pigment composition of claim 1, comprising greater than about 90% of the γ crystal form.

6. A chlorinated copper phthalocyanine pigment composition, comprising a pure, or substantially pure, γ crystal form having an X-ray powder diffraction pattern in accordance with the FIGURE and having a primary structure:

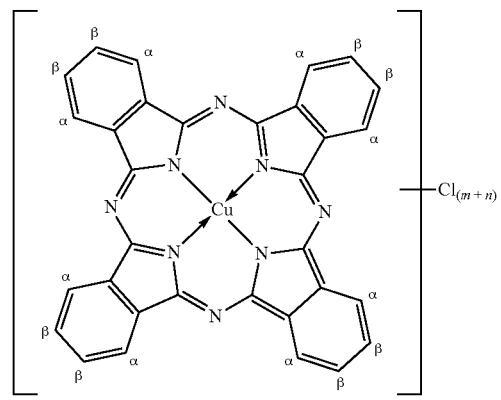

having α- and β-positions, where chlorine substitution at the α- and β-positions on the phthalocyanine is defined by: $0.05 < m+n \leq 4$;
where $m \geq n$
$n > 0.2$, and
where m represents the average number of chlorine substituents at the α-position, and n represents the average number of chlorine substituents at the β-position.

7. The pigment composition of claim 6, where the pigment composition has X-ray powder diffraction d-values at about 13.66, 12.29, 9.71, 8.61, 5.81, 5.66, 3.56, 3.38, 3.20, and 3.16.

8. A chlorinated copper phthalocyanine pigment composition of claim 6, comprising greater than about 90% of the novel crystal form.

9. A method of making a γ crystal form of a chlorinated copper phthalocyanine pigment comprising combining phthalic anhydride, 3-chlorophthalic anhydride, chlorophthalic anhydride, urea, copper(I) chloride, ammonium dimolybdate, Polymeric Dispersant A, and a branched alkylbenzene solvent and heating the mixture with stirring;
wherein the Polymeric Dispersant A is Pc-[$SO_2$—NH—($CHCH_3CH_2O$) ($CH_2CH_2O$)$_y$—$CH_3$]$_n$, where Pc is a radical of copper phthalocyanine, x is 0 to about 30, y is 0 to about 100, x+y≥3, and n is 1-4.

10. The method of claim 9, wherein the pigment was isolated by filtration, washed to a conductivity less than about 250 μmhos/cm, dried, homogenized, and passed through a mesh screen to afford a finished product.

11. A coating, ink, waterborne or solvent borne pigment preparation, electrophotographic toner and developer, plastics, color filters, powder coating materials, comprising the chlorinated copper phthalocyanine pigment composition of claim 1.

* * * * *